United States Patent
Baumann et al.

(10) Patent No.: US 9,221,149 B2
(45) Date of Patent: Dec. 29, 2015

(54) METHOD FOR POLISHING SEMICONDUCTOR WAFERS BY MEANS OF SIMULTANEOUS DOUBLE-SIDE POLISHING

(71) Applicant: Siltronic AG, Munich (DE)

(72) Inventors: Rainer Baumann, Burghausen (DE); Johannes Staudhammer, Burghausen (DE); Alexander Heilmaier, Haiming (DE); Leszek Mistur, Burghausen (DE); Klaus Roettger, Bachmehring (DE)

(73) Assignee: SILTRONIC AG, Munich (DE)

( * ) Notice: Subject to any disclaimer, the term of this patent is extended or adjusted under 35 U.S.C. 154(b) by 0 days.

(21) Appl. No.: 14/249,377

(22) Filed: Apr. 10, 2014

(65) Prior Publication Data
US 2014/0308878 A1    Oct. 16, 2014

(30) Foreign Application Priority Data
Apr. 12, 2013 (DE) .......................... 10 2013 206 613

(51) Int. Cl.
*B24B 37/08* (2012.01)
*H01L 21/304* (2006.01)
*B24B 53/017* (2012.01)

(52) U.S. Cl.
CPC ............... *B24B 37/08* (2013.01); *B24B 53/017* (2013.01); *H01L 21/304* (2013.01)

(58) Field of Classification Search
CPC ........ B24B 53/017; B24B 53/02; B24B 37/08
USPC ............................................ 451/56, 57, 443
See application file for complete search history.

(56) References Cited

U.S. PATENT DOCUMENTS

| | | | |
|---|---|---|---|
| 5,538,460 A * | 7/1996 | Onodera | 451/72 |
| 5,718,618 A * | 2/1998 | Guckel et al. | 451/41 |
| 6,042,688 A * | 3/2000 | Masumura et al. | 156/345.14 |
| 6,206,765 B1 * | 3/2001 | Sanders et al. | 451/56 |
| 6,338,672 B1 * | 1/2002 | White | 451/443 |
| 6,817,924 B1 * | 11/2004 | Lin et al. | 451/8 |
| 8,647,174 B2 | 2/2014 | Takai | |
| 2002/0160689 A1 * | 10/2002 | Benning et al. | 451/5 |
| 2007/0054606 A1 * | 3/2007 | Nakamura et al. | 451/56 |
| 2007/0054607 A1 * | 3/2007 | Yasuoka et al. | 451/56 |
| 2009/0305615 A1 * | 12/2009 | Uchiyama | 451/57 |
| 2012/0028546 A1 | 2/2012 | Pietsch | |
| 2012/0189777 A1 * | 7/2012 | Pietsch | 427/359 |
| 2014/0235143 A1 * | 8/2014 | Staudhammer | 451/56 |

FOREIGN PATENT DOCUMENTS

| | | |
|---|---|---|
| DE | 102010032501 A1 | 2/2012 |
| JP | 2007118146 A | 5/2007 |
| WO | 2010128631 A1 | 11/2010 |

* cited by examiner

*Primary Examiner* — George Nguyen
(74) *Attorney, Agent, or Firm* — Leydig, Voit & Mayer, Ltd.

(57) ABSTRACT

A method of polishing a semiconductor wafer includes simultaneous double-side polishing the wafer in a gap of a polishing device between a lower polishing plate covered with a lower polishing pad and upper polishing plate covered with an upper polishing pad while supplying a polishing agent. A first of the upper and lower polishing pads is dressed using a dressing tool. The dressing tool is mounted in the gap so that it extends from the inner edge to the outer edge of the first polishing pad. The distance between the dressing tool and a second of the upper and lower polishing pads at the inner edge of the second polishing pad differs from a corresponding distance at the outer edge of the second polishing pad. After the dressing, the at least one semiconductor wafer in the gap is polished.

20 Claims, 5 Drawing Sheets

METHOD FOR POLISHING SEMICONDUCTOR WAFERS BY MEANS OF SIMULTANEOUS DOUBLE-SIDE POLISHING

CROSS REFERENCE TO RELATED APPLICATIONS

This application claims priority from German Patent Application No DE 10 2013 206 613.9 filed Apr. 12, 2013, which is hereby incorporated by reference herein in its entirety.

FIELD

The invention relates to a method for polishing semiconductor wafers by means of simultaneous double-side polishing in a gap between a lower and an upper polishing pad of a polishing device while supplying a polishing agent, the lower polishing pad covering a lower polishing plate and the upper polishing pad covering an upper polishing plate, and the polishing plates and the polishing pads having an inner edge and an outer edge. The method comprises dressing of one or both polishing pads with a dressing tool and polishing of semiconductor wafers in the gap after the dressing.

BACKGROUND

Semiconductor wafers, in particular semiconductor wafers of monocrystalline silicon, are needed as basic materials for the production of electronic components. The manufacturers of such components require that the delivered semiconductor wafers have front and back sides which are as far as possible planar and parallel to one another. In order to meet this requirement, a processing step for the production of such semiconductor wafers conventionally comprises polishing thereof. Double-side polishing (DSP), in which the front side and the back side of the semiconductor wafer are simultaneously polished in the presence of a polishing agent, is particularly suitable. During DSP, the semiconductor wafer is located together with further semiconductor wafers in a gap between a lower polishing pad and an upper polishing pad. Each of the polishing pads covers a corresponding lower and upper polishing plate. The semiconductor wafers lie during the DSP in openings of carriers, which guide and protect them. The carriers are externally toothed disks, which are arranged between an inner and an outer toothed wheel or pin gear of the polishing device. A toothed wheel or pin gear will be referred to below as a drive gear. During polishing, the carriers are set in a rotational movement about their middle and the middle of the polishing plates by the inner drive gear or by the inner and outer drive gears. Furthermore, the polishing plates are usually also rotated in countersense about their axes, which results in kinematics characteristic of DSP, in which a point on a semiconductor wafer side to be polished follows a cycloid path on the corresponding polishing pad.

Before first use and after a certain degree of wear is reached, it is usual to dress the lower and upper polishing pads. During the dressing, the surface of the polishing pad is roughened and slight material abrasion is induced in order to impart a favourable working state to the polishing pad.

According to U.S. Patent Publication No. 2012/0189777, it is advantageous to subject the polishing plates to shaped dressing ("truing"), so that the gap between the polishing pads is as far as possible uniformly wide. Furthermore, it is described therein that, in order to dress the polishing pads, the carriers are replaced by dressing rings. The dressing is carried out in the presence of a cooling lubricant, the dressing rings being moved over the lower and upper polishing pads, in the absence of inserted semiconductor wafers, in a movement similar to the kinematics of the DSP.

SUMMARY

In an embodiment, the present invention provides a method of polishing at least one semiconductor wafer including simultaneous double-side polishing the at least one wafer in a gap of a polishing device between a lower polishing plate covered with a lower polishing pad and upper polishing plate covered with an upper polishing pad while supplying a polishing agent. The polishing plates and polishing pads have an inner edge and an outer edge. A first of the upper and lower polishing pads is dressed using a dressing tool. The dressing includes rotating the respective polishing plate covered with the first polishing pad. The dressing tool is mounted in the gap in such a way that it extends from the inner edge to the outer edge of the first polishing pad. The distance between the dressing tool and a second of the upper and lower polishing pads at the inner edge of the second polishing pad differs from a corresponding distance at the outer edge of the second polishing pad. After the dressing, the at least one semiconductor wafer in the gap is polished.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
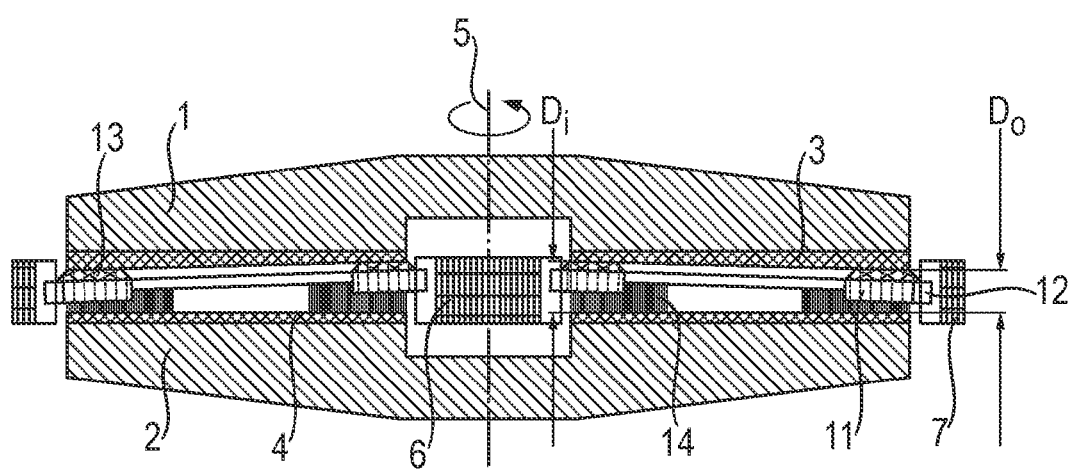
FIG. 1 shows a sectional representation of an arrangement of the dressing tool during the dressing of a polishing pad according to the first embodiment of the invention.

An aspect of the present invention is to provide an approach which leads to an improvement in the planarity of the semiconductor wafers after DSP has been carried out.

In an embodiment, the present invention provides a method for polishing semiconductor wafers by means of simultaneous double-side polishing in a gap between a lower and an upper polishing pad of a polishing device while supplying a polishing agent, the lower polishing pad covering a lower polishing plate and the upper polishing pad covering an upper polishing plate, and the polishing plates and the polishing pads having an inner edge and an outer edge, comprising dressing of one, or first one and subsequently the other, polishing pad with a dressing tool, the polishing plate which is covered with the polishing pad to be dressed being rotated and the dressing tool being mounted in the gap in such a way that it extends from the inner edge to the outer edge of the polishing pad to be dressed; and polishing of semiconductor wafers in the gap after the dressing, characterized in that, during the dressing, the distance of the dressing tool from the polishing pad lying opposite the polishing pad to be dressed, at the inner edge of this polishing pad, differs from the corresponding distance at the outer edge of this polishing pad.

The inventors have discovered that in order to improve the planarity, particularly in the edge region of the semiconductor wafer, it is advantageous for the semiconductor wafer to be subjected to DSP and in this case for the width of the gap to be modified from the inner edge to the outer edge of the polishing pads, instead of remaining the same. The width of the gap is the distance between the lower and upper polishing pads. It preferably varies linearly. The gap is preferably wider at the inner edge of the polishing pads than at the outer edge of the polishing pads, and accordingly has a profile with a wedge shape. The amount of the difference in the width of the gap is from 10 μm to 250 μm, preferably from 30 μm to 150 μm, when the width of the gap at the inner edge of the polishing pads is compared with the width of the gap at the outer edge of the polishing pads. The dressed polishing pad is accordingly preferably thinner at the inner edge than at the outer edge.

The favourable profile of a gap is achieved by dressing one or both polishing pads with a dressing tool. If both polishing pads are dressed, the lower or upper polishing pad is dressed first and the polishing pad lying opposite the dressed polishing pad is subsequently dressed.

The dressing tool preferably comprises a plurality of dressing rings and particularly preferably three dressing rings, which are placed instead of carriers between the inner and outer drive gears. Each dressing ring has an upper side, facing toward the polishing pad to be dressed, which is provided with grinding bodies. The lower side lying underneath may likewise be provided with grinding bodies. The grinding bodies contain abrasively acting material, preferably grains of diamond, cubic boron nitride, corundum or silicon carbide. The average grain size is preferably from 60 μm to 300 μm.

The dressing tool extends from the inner edge to the outer edge of the polishing pad to be dressed. According to an embodiment of the invention, during the dressing, the distance from the dressing tool to the polishing pad lying opposite the polishing pad to be dressed is different at the inner edge of this polishing pad than the corresponding distance at the outer edge of this polishing pad. This is achieved by the dressing tool being mounted in such a way that it is arranged tilted from a horizontal position. Preferably, a spacer is placed between the dressing tool and the polishing pad lying opposite the polishing pad to be dressed. The distance between the dressing tool and the polishing pad lying opposite the polishing pad to be dressed is greater at the inner edge of this polishing pad than at the outer edge of this polishing pad. This is the distance between the dressing tool surface formed by the grinding bodies and the surface of the polishing pad lying opposite the polishing pad to be dressed.

According to one embodiment, the spacer comprises one or more rings which bear on the polishing pad lying opposite the polishing pad to be dressed. Such a spacer ring extends from the inner edge to the outer edge of the polishing pad. At the inner edge of the polishing pad, it has a thickness which is preferably greater than its thickness at the outer edge of the polishing pad. The dressing tool bears on the spacer in the region of the inner and outer edges of the polishing pad. Accordingly, the distance between the dressing tool and the polishing pad lying opposite the polishing pad to be dressed is greater at the inner edge of this polishing pad than at the outer edge of the polishing pad.

Preferably, three spacers are provided, which bear on the polishing pad lying opposite the polishing pad to be dressed while being uniformly distributed. The spacers are preferably connected to one another by bars which act as security against twisting of the spacers.

In order to dress a polishing pad, the polishing plates are closed, and the polishing plate which is covered by the polishing pad to be dressed is set in rotation. The other polishing plate is not rotated. Furthermore, the dressing tool mounted according to an embodiment of the invention is set in rotation about its own middle with the aid of the inner or outer drive gear or with the aid of both. The upper polishing plate is universally suspended, in order to permit relative movement of the dressing tool and the polishing plate in motion, as a result of which the polishing pad to be dressed is processed over its full surface.

According to another embodiment, the spacer is a single ring which bears on the polishing pad lying opposite the polishing pad to be dressed. This spacer ring encloses the inner edge of the polishing pad and the inner drive gear. The dressing tool bears on the spacer in the region of the inner edge of the polishing pad and on the polishing pad in the region of the outer edge of the polishing pad. At the inner edge of this polishing pad, the distance between the dressing tool and the polishing pad lying opposite the polishing pad to be dressed is equal to the sum of the thickness of the dressing tool and the thickness of the spacer. At the outer edge of the polishing plate, the distance is less by the thickness of the spacer.

The dressing is preferably carried out in the presence of a cooling lubricant.

Following the dressing of one or both polishing pads, semiconductor wafers lying in carriers are subjected to simultaneous double-side polishing in the gap between the polishing pads, a plurality of semiconductor wafers being polished simultaneously in one polishing run. A plurality of polishing runs are carried out before one of the polishing pads or both polishing pads are dressed according to an embodiment of the invention once more. The subsequent dressing can be obviated so long as the profile of the gap retains the desired wedge shape. If the polishing no longer meets the expectations placed on it in respect of the planarity of the polished semiconductor wafers, owing to the nonuniform polishing wear, the desired profile of the gap should be restored. In this case, a further dressing cycle is carried out. The polishing pads may possibly need to be replaced beforehand.

According to FIG. 1, the lower polishing plate 2 and the upper polishing plate 1 extend radially from an inner edge to an outer edge, as do the lower polishing pad 4 and the upper polishing pad 3, which cover the respective polishing plates. The lower polishing pad 4 forms an annular surface which at the inner edge adjoins an inner pin gear 6 of the polishing device and at the outer edge adjoins an outer pin gear 7 of the polishing device. Three dressing rings 11 are placed on the lower polishing pad 4 while being uniformly distributed. They respectively bear on a spacer ring 14 made of plastic. The spacer rings have a wedge shape in cross section. The spacer rings 11 extend from the inner edge to the outer edge of the upper polishing pad 3 to be dressed, and have teeth 12 on the circumference, which engage into the pins of the inner and outer pin gears 6, 7.

The upper sides of the spacer rings 11 are provided with grinding bodies 13. During the dressing of the upper polishing pad, the upper polishing pad 3 (upon upper polishing plate 1) is rotated about its rotation axis 5. The lower polishing pad 4 (upon lower polishing plate 2) remains stationary during this. The distance $D_i$ between the lower polishing pad 4 and the spacer ring 11 at the inner edge of the polishing pad is greater than the corresponding distance $D_o$ at the outer edge of the polishing pad.

Owing to the wedge-shaped configuration of the cross section of the spacer rings 14 with different thickness on the inner and outer edges of the polishing pad 4, the spacer rings 11 assume an oblique position relative to the horizontal during the dressing. Accordingly, the material abrasion from the upper polishing pad 3, induced during the dressing, is dependent on the radial position. It decreases from the inner edge of the polishing pad to the outer edge of the polishing pad.

If it is intended subsequently to dress the lower polishing pad 4 as well, the dressing rings 11 and the spacer rings 14 are rotated through 180° and arranged in the gap between the polishing pads, and the lower polishing pad 2 is rotated instead of the upper polishing pad 1 during the dressing.

Figure 2:
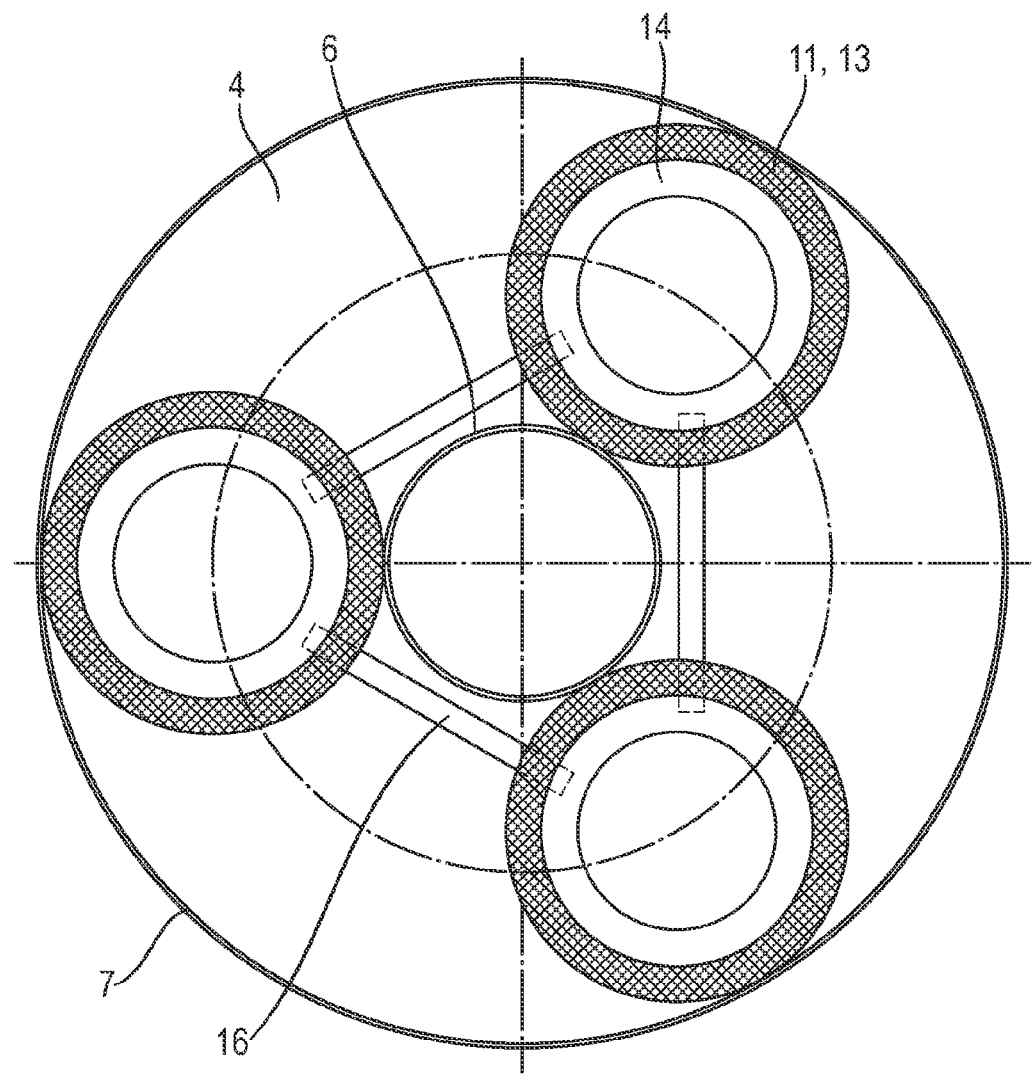
FIG. 2 shows the arrangement according to FIG. 1 in a plan view of the polishing pad lying opposite the polishing pad to be dressed.

FIG. 2 shows the arrangement of the dressing rings 11 and the spacer rings 14 in a plan view of the lower polishing pad 4 lying opposite the polishing pad 3 to be dressed. The spacer rings 14 are connected to one another by bars 16, which prevent the spacer rings from executing rotational movements during the dressing of the polishing pad.

Figure 3:
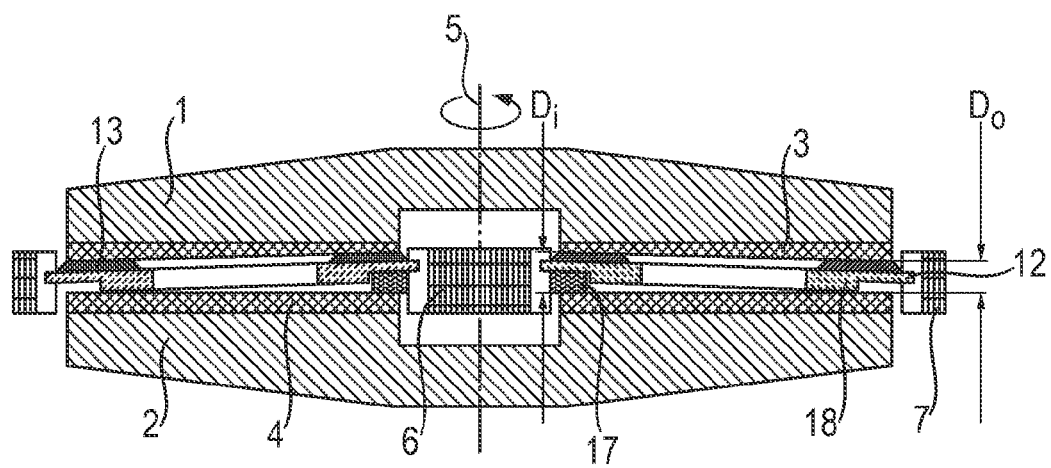
FIG. 3 shows a sectional representation of an arrangement of the dressing tool during the dressing of a polishing pad according to the second embodiment of the invention.

The embodiment according to FIG. 3 differs from the embodiment according to FIG. 1 essentially in that a single spacer ring 17 is used as a spacer, which is placed around the inner edge of the lower polishing pad 4 and around the inner drive gear 6. The spacer ring 17 has a uniform thickness. The dressing tool in this embodiment is a dressing ring 18, which is thicker than the dressing tool of the other embodiment and which therefore has greater stiffness. The dressing ring 18 bears on the spacer ring 17 in the region of the inner edge of the lower polishing pad 4 and on the lower polishing pad 4 in the region of the outer edge of the lower polishing pad 4. Preferably, three such dressing rings 18 are provided. The distance $D_i$ between the dressing tool 18 (or, in FIGS. 1 and 2, 11) and the lower polishing pad 4 lying opposite the polishing pad 3 to be dressed is greater at the inner edge of the lower polishing pad than the corresponding distance $D_o$ at the outer edge of the lower polishing pad 4. The difference between the thicknesses corresponds to the thickness of the spacer ring 17.

Figure 4:
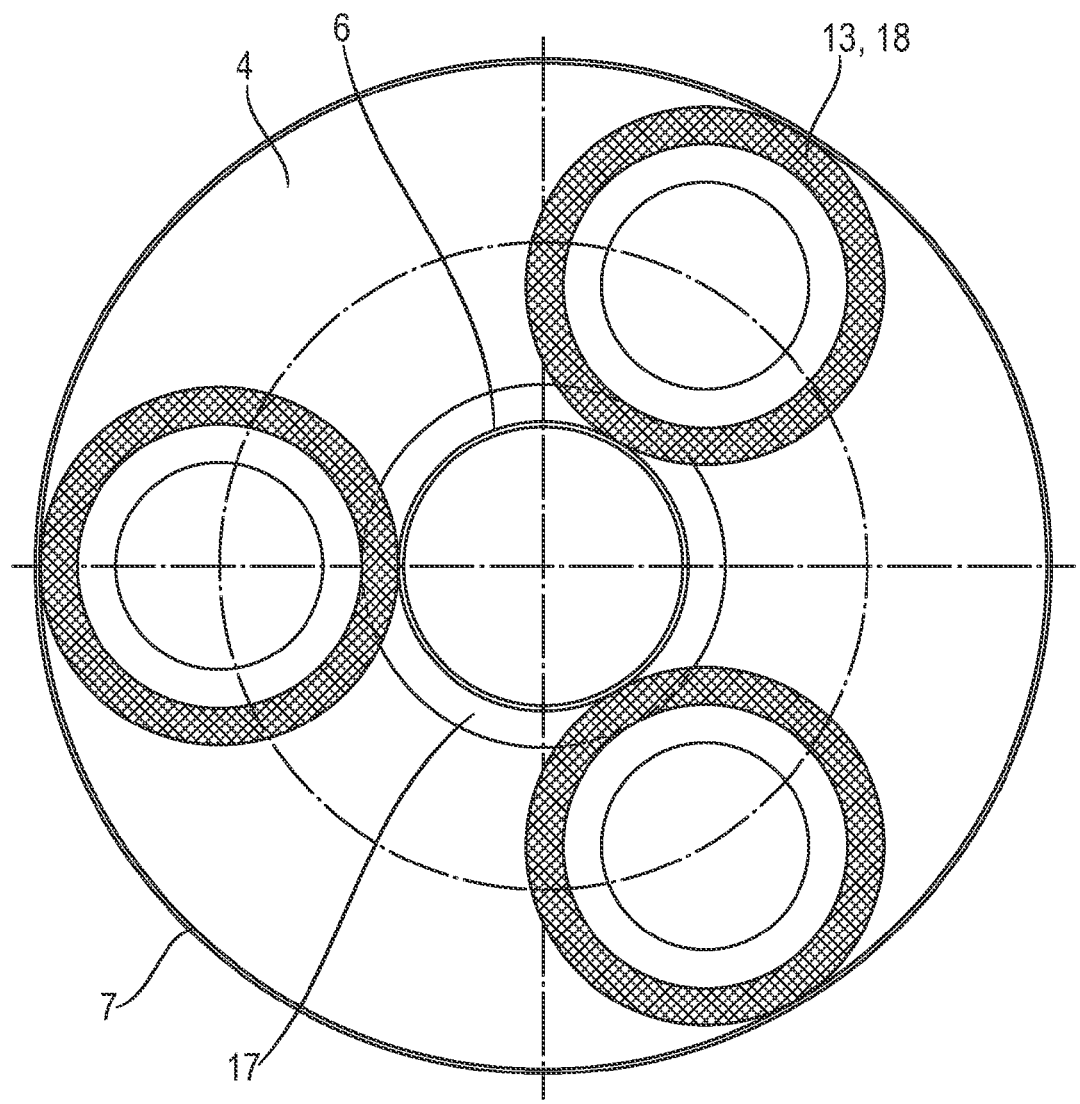
FIG. 4 shows the arrangement according to FIG. 3 in a plan view of the polishing pad lying opposite the polishing pad to be dressed.

FIG. 4 shows the arrangement of the dressing rings 18 in a plan view of the lower polishing pad 4. The dressing rings 18 bear on the spacer ring 17 in the region of the inner edge of the lower polishing pad 4. The spacer ring 17 encloses the inner edge of the lower polishing pad 4 and the inner drive gear 6.

Figure 5:
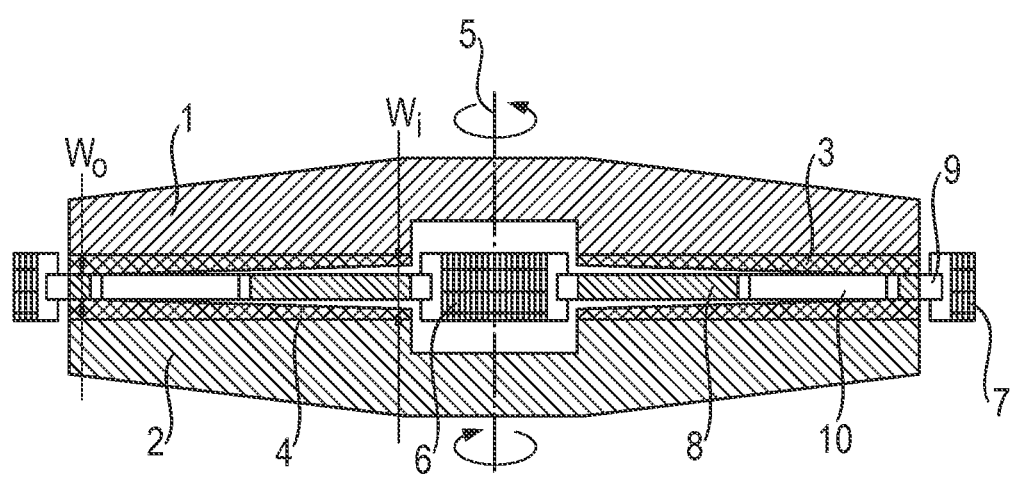
FIG. 5 shows a sectional representation of an arrangement of semiconductor wafers during DSP in a gap having a wedge-shaped profile.

FIG. 5 shows a sectional representation of the arrangement of semiconductor wafers 10 during DSP in a gap having a wedge-shaped profile. The wedge shape of the profile is the result of two successively performed operations, during which the polishing pads are dressed in the manner described. The semiconductor wafers lie in recesses of carriers 8. The carriers have outer teeth 9, which engage with the inner pin gear 6 and the outer pin gear 7. The width $W_i$ of the gap at the inner edge of the polishing pads is greater than the width $W_o$ of the gap at the outer edge of the polishing pads. The polishing pads are thinner at the inner edge than at the outer edge. During the DSP, the polishing pads are rotated in countersense about their rotational axes 5.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A method of polishing at least one semiconductor wafer in a gap of a polishing device between a lower polishing plate, covered with a lower polishing pad, and an upper polishing plate, covered with an upper polishing pad, while supplying a polishing agent, the polishing plates and the polishing pads having an inner edge and an outer edge, the method comprising:
    dressing a first of the upper and lower polishing pads using a dressing tool, the dressing including rotating the respective polishing plate covered with the first polishing pad, the dressing tool being mounted in the gap in such a way that it extends from the inner edge to the outer edge of the first polishing pad, and a distance between the dressing tool and a second of the upper and lower polishing pads at the inner edge of the second polishing pad differing from a corresponding distance at the outer edge of the second polishing pad; and
    simultaneous double-side polishing the at least one semiconductor wafer in the gap after the dressing.

2. The method as recited in claim 1 further comprising dressing the second polishing pad subsequent to the dressing of the first polishing pad.

3. The method as recited in claim 1, wherein one or more polishing methods are carried out before the at least one polishing pad undergoes subsequent dressing.

4. The method as recited in claim 1, wherein the dressing imparts a profile to the gap between the upper and lower polishing pads such that a width of the gap at the inner edge of the polishing pads is greater than the width of the gap at the outer edge of the polishing pads.

5. The method as recited in claim 1, wherein the dressing tool comprises one or more rings, which are placed between an inner and an outer drive gear of the polishing device and are set in rotation about the middle of the ring by one of the inner drive gear, the outer drive gear, or both the inner and outer drive gears.

6. The method as recited in claim 4, wherein the profile is thinner at the inner edge than at the outer edge.

7. The method as recited in claim 4, wherein an amount of difference in widths of the gap is in a range of from 10 to 250 μm.

8. The method as recited in claim 4, wherein an amount of difference in widths of the gap is in a range of from 30 to 150 μm.

9. A method for a polishing semiconductor wafer via simultaneous double-side polishing in a gap between a lower polishing pad, disposed on a lower polishing plate, and an upper polishing pad, disposed on an upper polishing plate, of a polishing device while supplying a polishing agent, the polishing plates and the polishing pads having an inner edge and an outer edge, the method comprising:
  dressing, with a dressing tool, the lower polishing pad while rotating the lower polishing plate, the dressing tool being mounted in the gap in such a way that the dressing tool extends from the inner edge to the outer edge of the lower polishing pad; and, after the dressing, double-side polishing the semiconductor wafer in the gap, wherein, during the dressing, a distance of the dressing tool from the upper polishing pad, at the inner edge of the upper polishing pad, differs from a distance at the outer edge of the upper polishing pad.

10. The method as recited in claim 9, further comprising, before the double-sided polishing, but subsequent to the dressing of the lower polishing pad:
  dressing the upper polishing pad.

11. The method as recited in claim 9, wherein one or more polishing methods are carried out before the at least one polishing pad undergoes subsequent dressing.

12. The method as recited in claim 9, wherein the dressing imparts a profile to the gap between the upper and lower polishing pads such that a width of the gap at the inner edge of the polishing pads is greater than the width of the gap at the outer edge of the polishing pads.

13. The method as recited in claim 9, wherein the dressing tool comprises one or more rings, which are placed between an inner and an outer drive gear of the polishing device and are set in rotation about the middle of the ring by one of the inner drive gear, the outer drive gear, or both the inner and outer drive gears.

14. The method as recited in claim 12, wherein the profile is thinner at the inner edge than at the outer edge.

15. A method for a polishing semiconductor wafer via simultaneous double-side polishing in a gap between a lower polishing pad, disposed on a lower polishing plate, and an upper polishing pad, disposed on an upper polishing plate, of a polishing device while supplying a polishing agent, the polishing plates and the polishing pads having an inner edge and an outer edge, the method comprising:
  dressing, with a dressing tool, the upper polishing pad while rotating the upper polishing plate, the dressing tool being mounted in the gap in such a way that the dressing tool extends from the inner edge to the outer edge of the upper polishing pad; and, after the dressing, double-side polishing the semiconductor wafer in the gap, wherein, during the dressing, a distance of the dressing tool from the lower polishing pad, at the inner edge of the lower polishing pad, differs from a distance at the outer edge of the lower polishing pad.

16. The method as recited in claim 15, further comprising, before the double-sided polishing, but subsequent to the dressing of the lower polishing pad:
  dressing the upper polishing pad.

17. The method as recited in claim 15, wherein one or more polishing methods are carried out before the at least one polishing pad undergoes subsequent dressing.

18. The method as recited in claim 15, wherein the dressing imparts a profile to the gap between the upper and lower polishing pads such that a width of the gap at the inner edge of the polishing pads is greater than the width of the gap at the outer edge of the polishing pads.

19. The method as recited in claim 15, wherein the dressing tool comprises one or more rings, which are placed between an inner and an outer drive gear of the polishing device and are set in rotation about the middle of the ring by one of the inner drive gear, the outer drive gear, or both the inner and outer drive gears.

20. The method as recited in claim 18, wherein the profile is thinner at the inner edge than at the outer edge.

* * * * *